(12) United States Patent
Ueda et al.

(10) Patent No.: US 7,834,380 B2
(45) Date of Patent: Nov. 16, 2010

(54) FIELD EFFECT TRANSISTOR AND METHOD FOR FABRICATING THE SAME

(75) Inventors: Tetsuzo Ueda, Osaka (JP); Hidetoshi Ishida, Osaka (JP); Tsuyoshi Tanaka, Osaka (JP)

(73) Assignee: Panasonic Corporation, Osaka (JP)

( * ) Notice: Subject to any disclaimer, the term of this patent is extended or adjusted under 35 U.S.C. 154(b) by 593 days.

(21) Appl. No.: 11/297,386

(22) Filed: Dec. 9, 2005

(65) Prior Publication Data

US 2006/0124962 A1 Jun. 15, 2006

(30) Foreign Application Priority Data

Dec. 9, 2004 (JP) ............................. 2004-356369

(51) Int. Cl.
*H01L 29/66* (2006.01)

(52) U.S. Cl. ................ 257/192; 257/183; 257/187; 257/189; 257/200; 257/201; 257/283; 257/284; 257/330; 257/334; 257/E29.201; 257/E31.019; 257/E31.026; 257/E31.059; 257/E31.073; 257/E31.082; 257/E31.091; 257/E31.093; 257/E29.089; 257/E29.09; 257/E29.1; 438/259; 438/270

(58) Field of Classification Search ................ 257/283, 257/284, 330–334, E29.201; 438/259, 270
See application file for complete search history.

(56) References Cited

U.S. PATENT DOCUMENTS

| 5,409,849 | A | * | 4/1995 | Kishita et al. ............... 438/180 |
| 5,514,605 | A | * | 5/1996 | Asai et al. ................... 438/172 |
| 5,623,152 | A | * | 4/1997 | Majumdar et al. .......... 257/330 |
| 5,789,767 | A | * | 8/1998 | Omura ........................ 257/194 |
| 2004/0183096 | A1 | * | 9/2004 | Khan et al. ................ 257/183 |

FOREIGN PATENT DOCUMENTS

| JP | 2002-184972 | 6/2002 |
| JP | 2004079577 A | * 3/2004 |

OTHER PUBLICATIONS

Wu et al., "3.5 Watt AlGaN/GaN HEMTs and Amplifies at 35 GHz", International Electron Devices Technical Meeting, IEEE, 2003, pp. 579-581.

* cited by examiner

*Primary Examiner*—Lynne A Gurley
*Assistant Examiner*—Meiya Li
(74) *Attorney, Agent, or Firm*—McDermott Will & Emery LLP

(57) ABSTRACT

A field effect transistor includes a first semiconductor layer made of a multilayer of a plurality of semiconductor films and a second semiconductor layer formed on the first semiconductor layer. A source electrode and a drain electrode are formed on the second semiconductor layer to be spaced from each other. An opening having an insulating film on its inner wall is formed in a portion of the second semiconductor layer sandwiched between the source electrode and the drain electrode so as to expose the first semiconductor layer therein. A gate electrode is formed in the opening to be in contact with the insulating film and the first semiconductor layer on the bottom of the opening.

15 Claims, 7 Drawing Sheets

US 7,834,380 B2

FIELD EFFECT TRANSISTOR AND METHOD FOR FABRICATING THE SAME

CROSS-REFERENCE TO RELATED APPLICATIONS

This application claims priority under 35 U.S.C. §119 on Patent Application No. 2004-356369 filed in Japan on Dec. 9, 2004, the entire contents of which are hereby incorporated by reference. The entire contents of Patent Application No. 2005-348790 filed in Japan on Dec. 2, 2005 are also incorporated by reference.

BACKGROUND OF THE INVENTION

The present invention relates to a field effect transistor and a method for fabricating the same, and more particularly, it relates to a high-power transistor, a high-frequency transistor or the like using a nitride semiconductor and a method for fabricating the same.

A group III-V nitride compound semiconductor typified by gallium nitride (GaN) or the like, namely, what is called a nitride semiconductor, is a wide gap semiconductor, and the band gap at room temperature of, for example, gallium nitride (GaN) is 3.4 eV and that of aluminum nitride (AlN) is 6.2 eV. A nitride semiconductor is characterized by having a large breakdown electric field and having higher electron saturated drift velocity than a compound semiconductor such as gallium arsenic (GaAs) or silicon (Si) semiconductor. Therefore, it is regarded as a promising material for a high-frequency and high-power transistor and is earnestly being studied and developed.

In a hetero junction structure of aluminum gallium nitride (AlGaN) and gallium nitride (GaN), charges are produced on the hetero junction interface on the (0001) plane through spontaneous polarization and piezo polarization. Owing to the charges produced on the hetero junction interface, a sheet carrier concentration of $1 \times 10^{13}$ cm$^{-2}$ or more can be attained even when it is undoped. By utilizing a two-dimensional electron gas generated on the hetero junction interface, a hetero junction electric field transistor with a high current density can be realized. Accordingly, a field effect transistor using a nitride semiconductor is advantageous for attaining high output.

In general, for improving the high-frequency characteristics of a field effect transistor, it is the most effective means to reduce the gate length. For example, in order to improve the maximum oscillation frequency fmax, it is necessary to increase mutual conductance gm corresponding to a gain, to reduce the capacitance around the gate electrode and to reduce the resistance of the gate electrode.

For reducing the gate length in using a conventional gallium arsenic (GaAs)-based or indium phosphorus (InP)-based compound semiconductor, a structure and process for forming a T-shaped or mushroom-shaped gate electrode have been proposed and put to practical use. Also, in using a GaN-based semiconductor, a T-shaped gate electrode or the like has been studied and improvement of the high frequency characteristic of the maximum oscillation frequency fmax attained by such a gate electrode has been reported.

In using a GaN-based semiconductor, parasitic resistance such as ohmic contact resistance of a source electrode and a drain electrode tends to be large. Therefore, in order to realize a field effect transistor with good high frequency characteristics by effectively using high saturated drift velocity, it is necessary to increase the maximum electric field formed below the gate electrode as compared with the case where a GaAs-based compound semiconductor is used. Accordingly, it is difficult to realize a device with high frequency characteristics equivalent to or better than those of the GaAs-based or InP-based semiconductor unless a shorter gate length than in using a conventional compound semiconductor is realized.

FIG. 9 shows the cross-sectional structure of a conventional short-gate length field effect transistor using a nitride semiconductor such as GaN. As shown in FIG. 9, an undoped GaN layer 803 and an n-type AlGaN layer 804 are successively formed above a sapphire substrate 801 with a low-temperature GaN buffer layer 802 sandwiched between the sapphire substrate 801 and the undoped GaN layer 803. A source electrode 805 and a drain electrode 806 made of a multilayer of titanium (Ti) and aluminum (Al) are formed on the n-type AlGaN layer 804 to be spaced from each other. A T-shaped gate electrode 807 made of a multilayer of nickel (Ni), platinum (Pt) and gold (Au) is formed between the source electrode 805 and the drain electrode 806.

A gate length corresponding to the width of a contact portion between the T-shaped gate electrode 807 and the n-type AlGaN layer 804 is approximately 150 nm. The T-shaped gate electrode 807 may be formed through, for example, formation of a three-layered resist structure, electron-beam deposition and lift-off. For example, as the lowermost and the uppermost layers of the three-layered resist structure that can be exposed with electron beams, a resist of polymethyl methacrylate (PMMA) or the like is used, and as the intermediate layer, a resist of polydimethyl glutaric imide (PMGI) or the like is used. After exposing the uppermost PMMA resist by a width of approximately 1 μm, an opening is formed in the intermediate PMGI resist by using a developer. At this point, a peak portion of the T shape is formed in the uppermost PMMA resist. Subsequently, the lowermost PMMA resist exposed on the bottom of the opening is exposed with electron beams by a width of 150 nm.

The GaN-based electric field transistor including the T-shaped gate electrode has large mutual conductance, small capacitance around the gate electrode and low gate resistance, and hence can realize good high-frequency characteristics (see, for example, Y. F. Wu et al., "International Electron Devices Technical Meeting", 2003, pp. 579-581).

In the procedure for forming the T-shaped gate electrode of the conventional field effect transistor using the nitride semiconductor, however, it is necessary to perform the electron-beam exposure. Also, it is necessary to use the three-layered photoresist, and therefore, the cost of the procedure for forming the gate electrode is disadvantageously high. Furthermore, reproducibility of the procedure for forming the T-shaped gate electrode is poor, and the gate electrode easily collapses, which disadvantageously lowers the yield.

SUMMARY OF THE INVENTION

An object of the invention is realizing a field effect transistor using a nitride semiconductor and having a T-shaped gate electrode obtained without performing the electron-beam exposure in the fabrication and a method for fabricating the same by overcoming the aforementioned conventional disadvantages.

In order to achieve the object, in the field effect transistor of this invention, a T-shaped gate electrode is sandwiched between semiconductor layers having oxide films thereon.

Specifically, the first field effect transistor of this invention includes a first semiconductor layer made of a multilayer of a plurality of semiconductor films; a second semiconductor layer formed in contact with a principal plane of the first semiconductor layer; a source electrode and a drain electrode spaced from each other and formed on a face of the second semiconductor layer opposite to the first semiconductor layer; an opening formed in a portion of the second semiconductor layer sandwiched between the source electrode and the drain electrode and exposing the first semiconductor layer therein; an insulating film formed at least on an inner wall of the opening; and a gate electrode in contact with the insulating film and a portion of the first semiconductor layer exposed in the opening.

In the first field effect transistor of this invention, the gate electrode can be formed by filling the opening with an electrode material. Accordingly, a short-gate length T-shaped gate electrode can be easily formed without performing electron-beam exposure. Also, since the insulating film is formed on the inner wall of the opening, the gate length can be made shorter than the width of a mask used for forming the opening. Furthermore, a gate leakage current can be reduced.

In the first field effect transistor of the invention, the first semiconductor layer preferably includes a two-dimensional electron gas layer formed in a portion thereof below the gate electrode. Thus, the carrier mobility within a channel of the transistor can be increased, so that the electric field transistor can attain high performance with lower series resistance and larger mutual conductance.

In the first field effect transistor of the invention, the insulating film is preferably an oxide film formed by oxidizing a portion of the second semiconductor layer. Thus, the insulating film can be formed with high reproducibility and the thickness of the insulating film can be accurately controlled. Accordingly, the yield of the field effect transistor can be improved.

In the first field effect transistor of the invention, the insulating film is preferably formed in such a manner as to cover the portion of the second semiconductor layer sandwiched between the source electrode and the drain electrode excluding a bottom of the opening. In this structure, the top face of the semiconductor layer disposed between the source electrode and the drain electrode is wholly covered with the insulating film, and hence, the field effect transistor can attain a smaller leakage current and high reliability.

In the first field effect transistor of the invention, the insulating film preferably has a larger thickness in a portion thereof disposed on the inner wall of the opening than in other portions thereof. Thus, the leakage current can be further reduced and parasitic capacitance around the gate electrode can be reduced, and therefore, the field effect transistor can attain better high frequency characteristics.

In the first field effect transistor of the invention, a portion of the first semiconductor layer in contact with the gate electrode is different from the second semiconductor layer in at least one of a carrier concentration and a composition.

The second field effect transistor of this invention includes a first semiconductor layer made of a multilayer of a plurality of semiconductor films; a second semiconductor layer formed in contact with a principal plane of the first semiconductor layer; a source electrode and a drain electrode spaced from each other and formed on a face of the second semiconductor layer opposite to the first semiconductor layer; an opening formed in a portion of the second semiconductor layer sandwiched between the source electrode and the drain electrode and exposing the first semiconductor layer therein; and a gate electrode in contact with a portion of the first semiconductor layer exposed in the opening, and the first semiconductor layer has a mesa portion in a portion thereof sandwiched between the source electrode and the drain electrode.

In the second field effect transistor, the gate electrode can be formed by filling the opening with an electrode material. Accordingly, a T-shaped gate electrode with a short gate length can be easily formed without performing the electron-beam exposure. Also, since the second field effect transistor has the mesa portion, series resistance can be lowered, so as to improve high-frequency characteristics. Furthermore, on resistance can be lowered, so that a switching loss can be reduced.

The second field effect transistor preferably further includes an insulating film formed at least on an inner wall of the opening. Thus, the gate length can be made shorter than the width of a mask used for forming the opening. Also, a gate leakage current can be reduced.

In the second field effect transistor, the mesa portion preferably includes a two-dimensional electron gas layer extending between side walls of the mesa portion. Thus, a current flowing between the source and the drain does not pass through a potential barrier of a hetero junction forming the two-dimensional electron gas layer, and therefore, the field effect transistor can attain high performance with lower series resistance.

In the first or second field effect transistor of the invention, the first semiconductor layer is preferably made of a group III-V nitride semiconductor. Thus, the field effect transistor can attain a high breakdown voltage and higher saturated drift velocity and the mutual conductance can be further increased when the gate length is sufficiently short. In this manner, the field effect transistor can attain higher performance.

In the first or second field effect transistor of the invention, the first semiconductor layer preferably includes a gallium nitride film and a film represented by a general formula of $Al_xGa_{1-x}N$ (wherein $0<x\leq1$) and formed on the gallium nitride film.

In the first or second field effect transistor of the invention, the second semiconductor layer is preferably made of gallium nitride or a compound represented by a general formula of $In_yAl_zGa_{(1-y-z)}N$ (wherein $0<y<1$, $0<z<1$ and $y+z<1$). Thus, a hetero barrier is not formed on the interface between the second semiconductor layer and the first semiconductor layer, and hence, the field effect transistor can attain high performance with lower series resistance.

In the first or second field effect transistor, the first semiconductor layer preferably includes a gallium nitride film that is formed on a principal plane of a substrate and has a (11-20) plane of a plane direction as a principal plane thereof, and the substrate is preferably made of sapphire having a (1-102) plane of the plane direction as a principal plane thereof. Thus, the transistor can be formed on a non-polar plane, so as not to be affected by a polarization electric field. Accordingly, the threshold voltage can be easily controlled, and a normally off characteristic indispensable for a power switching device can be easily realized.

In the first or second field effect transistor of the invention, the first semiconductor layer is preferably formed on a (0001) plane of a plane direction of the substrate, and the gate electrode is preferably linearly formed along a <11-20> direction of a zone axis of the substrate. Thus, in the case where the semiconductor layer is formed through regrowth, a step portion can be linearly formed, and when the gate electrode is formed so as to cover the step portion, the gate length can be made uniform. Accordingly, the field effect transistor can be attain high performance with high reproducibility.

The method for fabricating a field effect transistor of the invention includes the steps of (a) forming, on a substrate, a first semiconductor layer made of a multilayer of a plurality of semiconductor films; (b) selectively forming a mask on the first semiconductor layer; (c) forming a second semiconductor layer on the first semiconductor layer by using the mask; (d) forming an opening in the second semiconductor layer by removing the mask; (e) forming, in a portion of the second semiconductor layer including the opening, a gate electrode in contact with a portion of the first semiconductor layer exposed in the opening; and (f) forming a source electrode and a drain electrode on respective sides of the gate electrode on the second semiconductor layer.

The method for fabricating a field effect transistor of this invention includes the step of forming the second semiconductor layer on the first semiconductor layer by using the mask and the step of forming the opening in the second semiconductor layer by removing the mask. Accordingly, a recess structure of the gate electrode can be formed through regrowth, and therefore, the threshold voltage and the drain current are determined depending upon the thickness of the first semiconductor layer. Accordingly, since the thickness of the first semiconductor layer can be accurately controlled through epitaxial growth, a field effect transistor with low series resistance can be realized with high reproducibility.

The method for fabricating a field effect transistor of the invention preferably further includes, after the step (c) and before the step (e), a step (h) of forming an insulating film by oxidizing a surface portion of the second semiconductor layer. Thus, since the gate electrode is disposed above the second semiconductor layer with the insulating film sandwiched therebetween, a gate leakage current can be further reduced, and parasitic capacitance can be lowered as compared with the case where the gate electrode is directly in contact with the second semiconductor layer.

The method for fabricating a field effect transistor of the invention preferably further includes, between the step (b) and the step (c), a step (g) of reducing a width of the mask along a gate length by etching. Thus, the line width of a portion of the first semiconductor layer exposed after oxidation can be further reduced, so that a high performance field effect transistor with a short gate length can be definitely realized.

In the method for fabricating a field effect transistor of the invention, the width of the mask along the gate length direction is preferably smaller than a thickness thereof in the step (b), and the etching performed in the step (g) is preferably isotropic etching performed along directions of the width and the thickness. Thus, the line width of the mask layer can be easily reduced.

In the method for fabricating a field effect transistor of the invention, the first semiconductor layer is formed to have a mesa portion in a portion thereof between the source electrode and the drain electrode in the step (a).

In the method for fabricating a field effect transistor of the invention, the first semiconductor layer and the second semiconductor layer are preferably made of a group III-V nitride semiconductor.

DETAILED DESCRIPTION OF THE INVENTION

Embodiment 1

Figure 1:
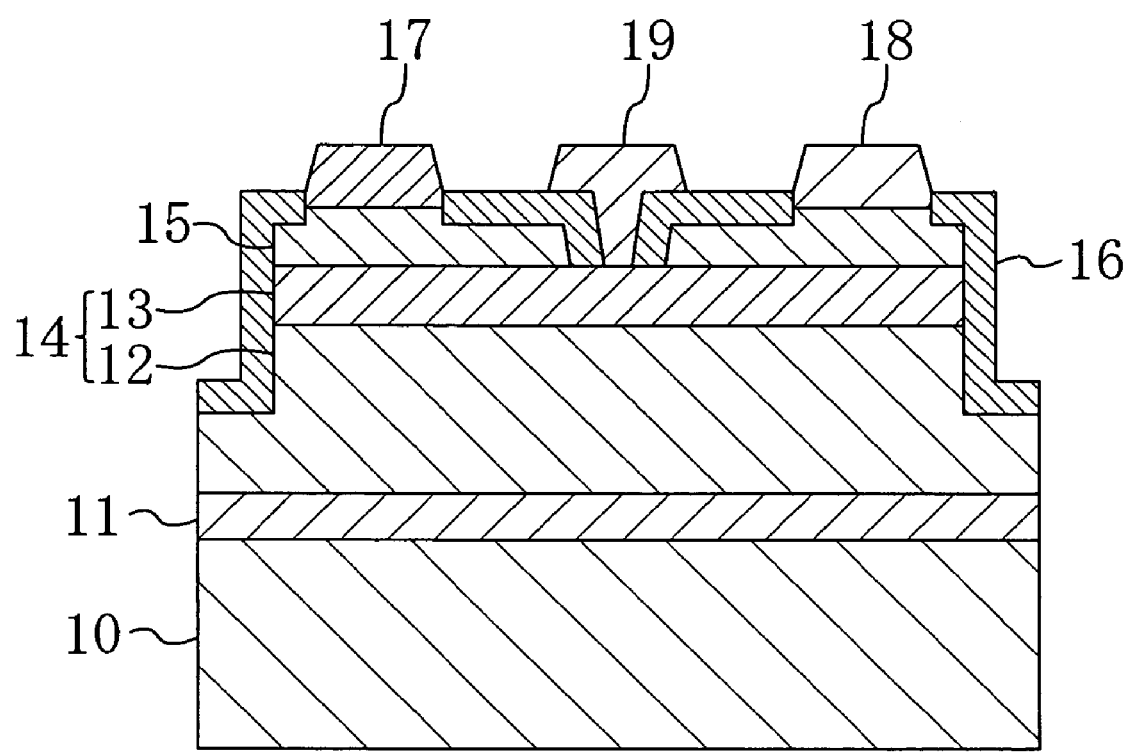
FIG. 1 is a cross-sectional view of a field effect transistor according to Embodiment 1 of the invention.

Embodiment 1 of the invention will now be described with reference to the accompanying drawings. FIG. 1 shows the cross-sectional structure of a field effect transistor (FET) according to Embodiment 1 of the invention. As shown in FIG. 1, a first semiconductor layer 14 composed of an undoped GaN film 12 and an n-type AlGaN film 13 successively stacked and a second semiconductor layer 15 made of n-type AlGaN are successively formed above a substrate 10 of sapphire with a buffer layer 11 of AlN disposed between the substrate 10 and the first semiconductor layer 14.

A source electrode 17 and a drain electrode 18 made of Ti, Al, Ni and Au successively stacked are formed on the second semiconductor layer 15 to be spaced from each other. In regions outside the source electrode 17 and the drain electrode 18, the second semiconductor layer 15, the AlGaN film 13 and part of the GaN film 12 of the first semiconductor layer 14 are selectively etched for isolation.

In a region of the semiconductor layer 15 sandwiched between the source electrode 17 and the drain electrode 18, an opening for exposing the AlGaN film 13 therein is formed. The inner wall of the opening, the top face of the second semiconductor layer 15 and the portion of the first semiconductor layer etched for isolation are covered with an insulating film 16. In the opening having the insulating film 16 on the inner wall, a T-shaped gate electrode 19 made of palladium silicon (PdSi) and in contact with the AlGaN film 13 on the bottom of the opening is formed.

In the FET of this embodiment, the T-shaped gate electrode 19 can be formed by filling the opening with a metal material as described later. Accordingly, a gate electrode having a short gate length and a large cross-sectional area can be easily formed without employing electron-beam lithography.

In the FET of this embodiment, the insulating film 16 of an oxide film (AlGaNO$_x$, wherein 0<x≦3) formed by oxidizing AlGaN is formed between the second semiconductor layer 15 and the gate electrode 19. Therefore, a leakage current flowing between the gate electrode 19 and the source electrode 17 or the drain electrode 18 through the second semiconductor layer 15 can be suppressed to have a small value, so that the breakdown voltage between, for example, the gate and the source can be improved.

Figure 2A:
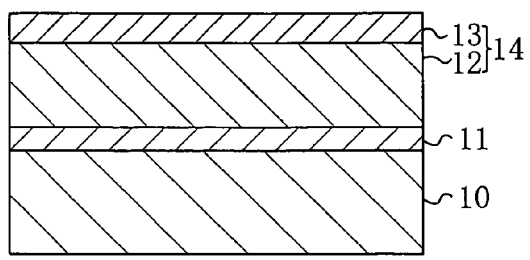
FIGS. 2A, 2B, 2C, 2D, 2E, 2F and 2G are cross-sectional views for showing procedures in a method for fabricating the field effect transistor of Embodiment 1.

FIGS. 2A through 2G are cross-sectional views for showing procedures in a fabrication method for the field effect transistor of Embodiment 1. As shown in FIG. 2A, after forming an AlN buffer layer 11 with a thickness of 0.5 μm on the (0001) plane of the plane direction of a substrate 10 of sapphire by metal organic chemical vapor deposition (MOCVD), an undoped GaN film 12 with a thickness of 3 μm and an AlGaN film 13 with a thickness of 25 nm are successively grown, thereby forming a first semiconductor layer 14.

Since charges are produced through spontaneous polarization and piezo polarization on the (0001) plane of the plane direction corresponding to the hetero junction interface between the GaN film 12 and the AlGaN film 13, a two-dimensional electron gas with a sheet carrier concentration at a level of $1\times10^{13}$ cm$^{-2}$ is generated even when the AlGaN film 13 is undoped. In this embodiment, the AlGaN film 13 is doped with Si to have n-type conductivity with a carrier concentration of approximately $4\times10^{18}$ cm$^{-3}$, and thus, the sheet carrier concentration is further increased.

A portion in the vicinity of the interface may be undoped in order to prevent diffusion of Si to the interface for improving the carrier mobility, or a portion in the vicinity of the top face may be undoped for reducing a leakage current of a Schottky electrode formed in contact with the AlGaN film 13.

Figure 2E:
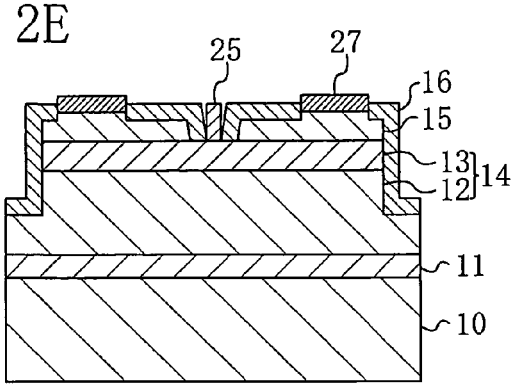
Figure 2B:
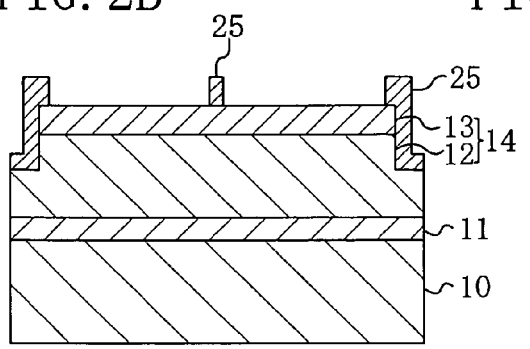

Next, as shown in FIG. 2B, the first semiconductor layer 14 made of a multilayer of the GaN film 12 and the AlGaN film 13 is dry etched through ICP (inductive-coupled plasma) etching or the like, so as to form a mesa portion by selectively removing the AlGaN film 13 and a part of the undoped GaN film 12 in portions excluding a transistor region. Subsequently, after forming a SiO$_2$ mask with a thickness of, for example, 200 nm on the first semiconductor layer 14 by chemical vapor deposition (CVD) using SiH$_4$ and O$_2$, the SiO$_2$ mask is selectively removed by reactive ion etching (RIE) or the like, so as to form a mask 25 in a gate electrode forming region and on step portions. Furthermore, the mask 25 are etched through the RIE or the like, so as to reduce its width. In this manner, the width of the mask along the gate length direction can be reduced, so as to easily form a short-gate length gate electrode.

Figure 2F:
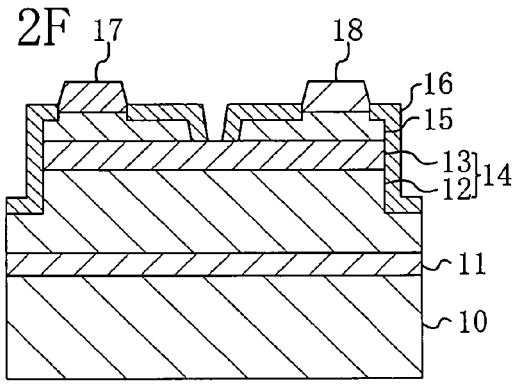
Figure 2C:
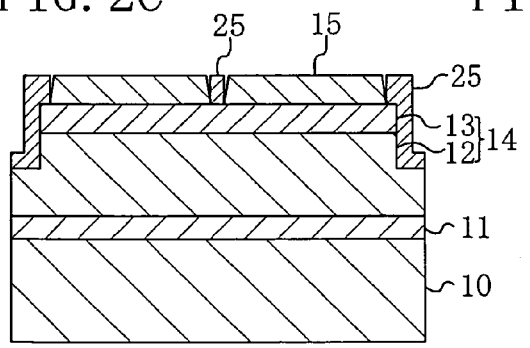

Next, as shown in FIG. 2C, by using the aforementioned patterned mask 25, a second semiconductor layer 15 with a thickness of, for example, 50 nm is selectively grown by the MOCVD. The carrier concentration in the second semiconductor layer 15 thus grown is as high as, for example, $1\times10^{19}$ cm$^{-3}$.

Figure 2G:
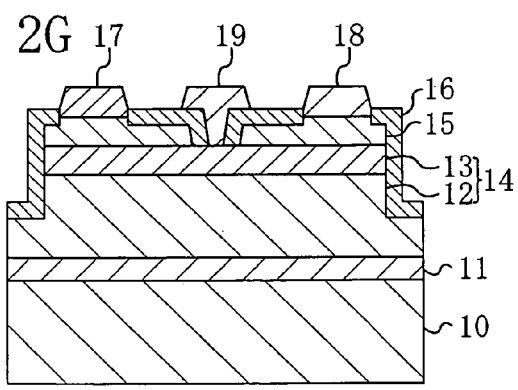
Figure 2D:
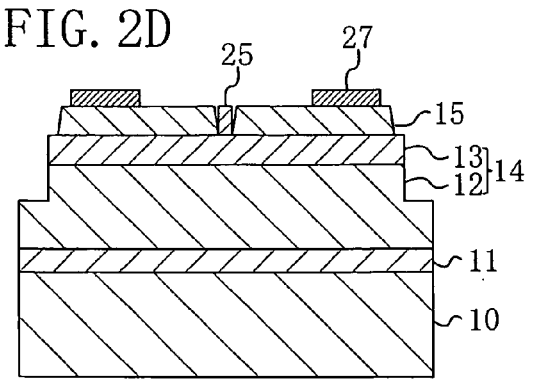

Then, as shown in FIG. 2D, a portion of the mask 25 provided in the gate electrode region is covered with a photoresist or the like, and the top face is wet etched by using a HF aqueous solution or the like, thereby removing the mask 25 merely on the step portions. Subsequently, a mask 27 of Si is formed on the top face of the second semiconductor layer 15 in a source electrode region and a drain electrode region by, for example, electron-beam deposition and lift-off. Then, the mask 27 is etched by the RIE or the like so as to reduce the width of the mask 27. In this embodiment, the width of the mask 27 is smaller than the thickness thereof, and the width can be reduced by isotropic gas etching or the like.

Next, as shown in FIG. 2E, the first semiconductor layer 14 and the second semiconductor layer 15 on which the mask 25 of SiO$_2$ and the mask 27 of Si are formed are annealed at, for example, 1000° C. in an O$_2$ atmosphere for four hours, and thus, surface portions of the first semiconductor layer 14 and the second semiconductor layer 15 are selectively oxidized, so as to form an insulating film 16. In this oxidizing process, the Si is diffused from the mask 27 toward the second semiconductor layer 15, and hence, the Si concentration in the surface portion of the second semiconductor layer 15 is increased, so as to largely reduce the ohmic contact resistance of a source electrode and a drain electrode.

Since the oxidizing velocity attained on the (0001) plane of the plane direction is smaller than that attained on the (1-100) plane or the (11-20) plane vertical to the (0001) plane, the thickness of a portion of the insulating film 16 selectively grown on the side face of the second semiconductor layer 15 is approximately five times as large as that formed on the top face of the second semiconductor layer 15 corresponding to the (0001) plane. It is noted that the symbol "-" of the crystal plane index means inversion of one index following the symbol.

Next, as shown in FIG. 2F, the mask 25 and the mask 27 are wet etched with, for example, a mixed solution of hydrofluoric acid and nitric acid. Thereafter, a source electrode 17 and a drain electrode 18 each composed of, for example, a multilayer of Ti, Al, Ni and Au are formed in the portions where the mask 27 has been formed.

Next, as shown in FIG. 2G, a T-shaped gate electrode 19 of PdSi is formed in the portion where the mask 25 has been formed. Since the insulating film 16 is grown in the lateral direction in the oxidizing process, the width of the opening where the gate electrode 19 is formed can be smaller than the width of the mask 25. For example, even when the width of the mask 25 of SiO$_2$ is, for example, approximately 200 nm, the width of the opening obtained after the oxidizing process is as small as approximately 100 nm. Since the insulating film 16 is formed, the gate length can be made shorter in the resultant field effect transistor as compared with the case where a gate electrode is directly formed in the opening.

According to the FET and the fabrication method for the same of this embodiment, an FET with a short gate length of approximately 100 nm can be fabricated by using an optical stepper without employing the electron-beam lithography. Accordingly, a GaN-based FET including a T-shaped short gate electrode having good high-frequency characteristics can be fabricated at lower cost than in the conventional technique. Also, since all the surfaces of the device excluding the electrodes are covered with the oxide film of AlGaNO$_x$, the isolation characteristic is improved, and hence, an FET with a small leakage current can be realized.

The Al composition ratio in the AlGaN film 13 and the second semiconductor layer 15 is approximately 25%, but may be 40% or more for increasing the sheet carrier concentration by using the two-dimensional electron gas generated on the hetero junction interface between the AlGaN film 13 and the GaN film 12. Also, when the Al composition ratio in the second semiconductor layer 15 is higher than the Al composition ratio in the AlGaN film 13, an electron barrier from the source electrode and the drain electrode toward a channel is not formed on the interface between the AlGaN film 13 and the second semiconductor layer 15. As a result, the source resistance of the FET can be reduced.

In order to further reduce the source resistance and the ohmic contact resistance of the source electrode and the drain electrode, the second semiconductor layer 15 is preferably doped with an impurity of Si at a high concentration of $1\times10^{19}$ cm$^{-3}$ or more. In growing the second semiconductor layer 15, the epitaxial growth face is preferably more linearly grown, and therefore, the direction of a gate finger preferably accords with the <11-20> direction of the zone axis of the GaN film 12. It is noted that the symbol "-" of the plane index of the zone axis means inversion of one index following the symbol.

Furthermore, the crystal of the substrate 10 of sapphire is rotated from the crystal of the GaN film 12 grown thereon by 30 degrees on the (0001) plane of the plane direction, and therefore, the gate finger is preferably formed along the <1-100> direction of the zone axis of the sapphire substrate. Although the isolation is obtained through a combination of the steps and the selective oxidation in this embodiment, an isolation region may be formed by increasing the resistance through ion implantation of, for example, boron (B).

Embodiment 2

Figure 3:
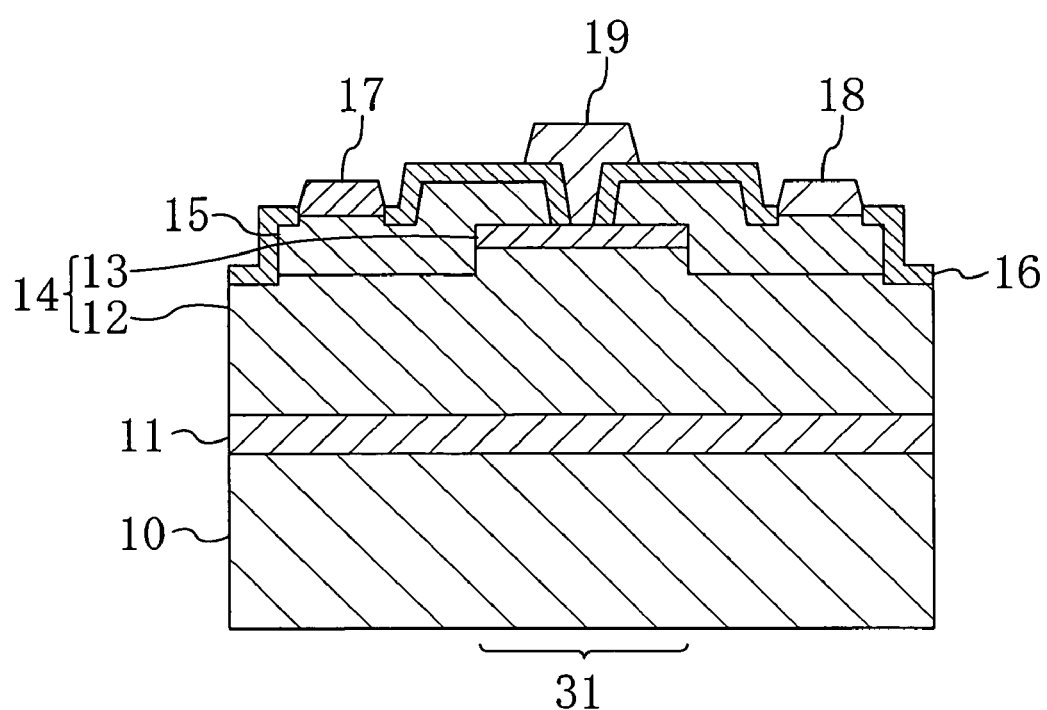
FIG. 3 is a cross-sectional view of a field effect transistor according to Embodiment 2 of the invention.

Embodiment 2 of the invention will now be described with reference to the accompanying drawings. FIG. 3 shows the cross-sectional structure of an FET according to Embodiment 2. In FIG. 3, like reference numerals are used to refer to like elements shown in FIG. 1 so as to omit the description.

As shown in FIG. 3, the FET of this embodiment is characterized by a mesa portion 31 formed in a first semiconductor layer 14. A buffer layer 11 of AlN is formed on a substrate 10 of GaN with a dislocation density as low as approximately $1 \times 10^6$ cm$^{-2}$. An undoped GaN film 12 and an n-type AlGaN film 13 are successively deposited on the buffer layer 11, thereby forming the first semiconductor layer 14. The mesa portion 31 with a width of approximately 1 μm is formed in a part of the structure of the first semiconductor layer 14 made of the multilayer of the GaN film 12 and the AlGaN film 13. A second semiconductor layer 15 of n-type GaN is regrown so as to cover the top face and the side face of the mesa portion 31. The second semiconductor layer 15 thus regrown has an opening for exposing the AlGaN film 13 therein, and the top face of the second semiconductor layer 15 and the inner wall of the opening are oxidized so as to form an insulating film 16 in their surface portions. In the opening having the insulating film 16 on the inner wall, a T-shaped gate electrode 19 of PdSi is formed.

In this embodiment, the second semiconductor layer 15 having low resistance and doped with Si at a high concentration of approximately $1 \times 10^{19}$ cm$^{-3}$ is formed so as to cover the side wall of the mesa portion 31 formed by selectively etching the first semiconductor layer 14. Therefore, no current flows beyond the hetero junction interface between the AlGaN film 13 and the GaN film 12, and hence, an effect to reduce series resistance can be improved.

Also, owing to the insulating film 16 formed on both sides of the gate electrode 19, a leakage current flowing between the gate electrode 19 and a source electrode 17 or a drain electrode 18 can be reduced in the same manner as in Embodiment 1. Thus, the breakdown voltage between the gate and the source can be improved.

Figure 4A:
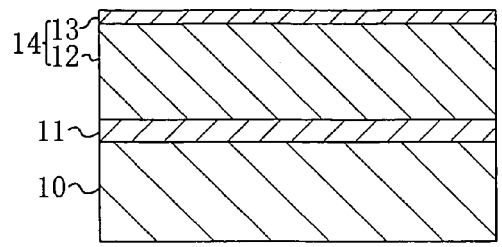
FIGS. 4A, 4B, 4C, 4D, 4E, 4F and 4G are cross-sectional views for showing procedures in a method for fabricating the field effect transistor of Embodiment 2.

FIGS. 4A through 4G are cross-sectional views for showing procedures in a fabrication method for the FET of Embodiment 2. First, as shown in FIG. 4A, a buffer layer 11 of AlN with a thickness of 0.5 μm, an undoped GaN film 12 with a thickness of 3 μm and an n-type AlGaN film 13 with a thickness of 25 nm are successively deposited in this order by the MOCVD on the (0001) plane of the plane direction of a substrate 10 of GaN.

In forming a first semiconductor layer 14 made of the multilayer of the GaN film 12 and the AlGaN film 13, portions of these films in the vicinity of their interface may be undoped for preventing diffusion of Si to the interface so as to improve the carrier mobility, or a surface portion of the first semiconductor layer 14 may be undoped so as to reduce a leakage current of a Schottky electrode formed in contact with the AlGaN film 13.

Figure 4B:
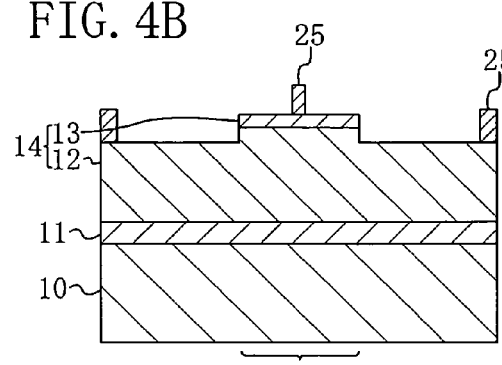

Next, as shown in FIG. 4B, in portions of the first semiconductor layer 14 excluding a source electrode forming region, a drain electrode forming region and a transistor forming region, the AlGaN film 13 and a part of the GaN film 12 are selectively removed by the dry etching such as the ICP etching, thereby forming a mesa portion 31. Subsequently, after forming a SiO$_2$ film with a thickness of, for example, 200 nm on the first semiconductor layer 14 by the CVD, the SiO$_2$ film is patterned so as to form a mask 25 covering the gate electrode forming region and regions outside the source electrode forming region and the drain electrode forming region. Furthermore, the mask 25 is etched by the RIE or the like so as to reduce its line width.

Figure 4C:
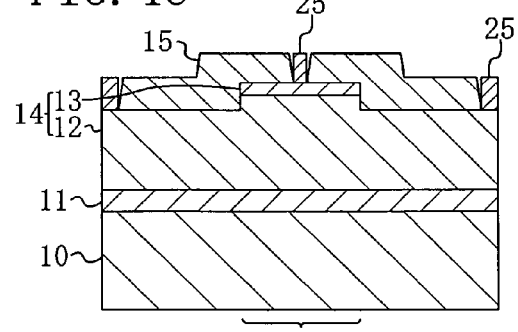

Then, as shown in FIG. 4C, a second semiconductor layer 15 of n-type GaN with a thickness of 50 nm is selectively grown by the MOCVD on the first semiconductor layer 14 on which the mask 25 has been formed. The carrier concentration of the second semiconductor layer 15 is set to be as high as approximately $1 \times 10^{19}$ cm$^{-3}$. Subsequently, a portion of the mask 25 corresponding to the gate electrode forming region is covered with a photoresist or the like, and the mask 25 is removed by wet etching using a HF aqueous solution or the like merely in the regions outside the source electrode forming region and the drain electrode forming region.

Figure 4D:
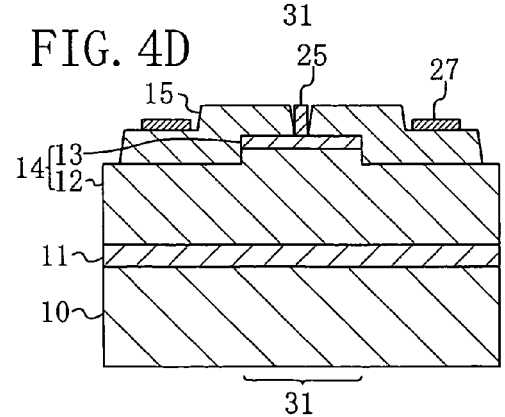

Next, as shown in FIG. 4D, a mask 27 of Si is formed on the second semiconductor layer 15 in the source electrode forming region and the drain electrode forming region by, for example, the electron-beam deposition and the lift-off.

Figure 4E:
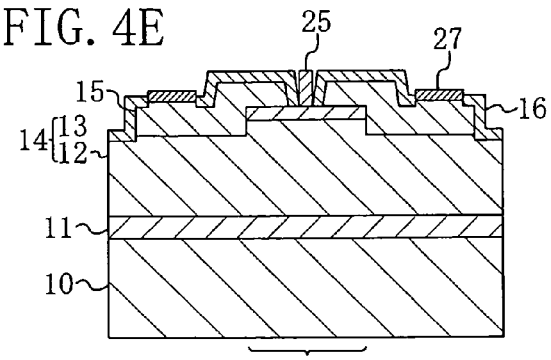

Subsequently, as shown in FIG. 4E, the first semiconductor layer 14 and the second semiconductor layer 15 on which the mask 25 of SiO$_2$ and the mask 27 of Si have been formed are annealed at, for example, 1000° C. in an O$_2$ atmosphere for four hours, and thus, surface portions of the first semiconductor layer 14 and the second semiconductor layer 15 are selectively oxidized, thereby forming an insulating film 16. In this oxidizing process, Si is diffused from the mask 27 toward the n-type second semiconductor layer 15, so as to increase the Si concentration in the surface portion of the second semiconductor layer 15, and thus, the ohmic contact resistance of a source electrode 17 and a drain electrode 18 can be largely reduced. In this embodiment, since the ohmic electrode is formed on the GaN, the ohmic contact resistance can be reduced as compared with the case where an ohmic electrode is formed on AlGaN, and thus, contact resistance of $5 \times 10^{-6}$ Ωm$^2$ or less can be realized.

Figure 4F:
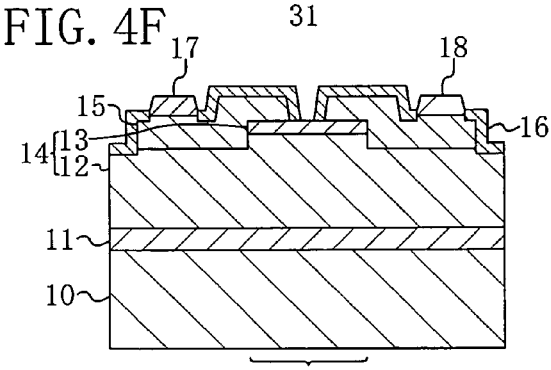

Then, as shown in FIG. 4F, after the mask 25 and the mask 27 are wet etched by using, for example, a mixed solution of hydrofluoric acid and nitric acid, the source electrode 17 and the drain electrode 18 made of, for example, a multilayer of Ti, Al, Ni and Au are formed on the second semiconductor layer 15 in the regions where the mask 27 has been formed.

Figure 4G:
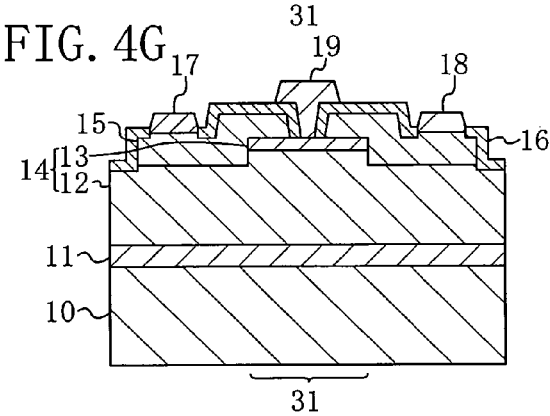

Next, as shown in FIG. 4G, a T-shaped gate electrode 19 of PdSi is formed in the region where the mask 25 has been formed. Since the insulating film 16 is grown in the lateral direction in the oxidizing process, the width of the opening where the gate electrode 19 is to be formed can be made smaller than the width of the mask 25. For example, even in the case where the mask 25 has a width of approximately 200 nm, the width of the opening obtained after the oxidizing process can be made as small as approximately 100 nm. Thus, since the insulating film 16 is formed, a field effect transistor with a shorter gate length can be realized as compared with the case where the gate electrode is directly formed in the opening.

According to the FET and the fabrication method for the same of this embodiment, an FET with a short gate length of approximately 100 nm can be fabricated by using an optical stepper without employing the electron-beam lithography. Accordingly, a GaN-based FET including a T-shaped short gate electrode having good high-frequency characteristics can be fabricated at lower cost than in the conventional technique. Also, since all the surfaces of the device excluding the electrodes are covered with the selectively oxidized film, the isolation characteristic is improved, and hence, an FET with a small leakage current can be realized.

Furthermore, in the FET of this embodiment, a multilayered body of Ti, Al, Ni and Au is used as the source electrode 17 and the drain electrode 18, and the source electrode 17 and the drain electrode 18 are formed in contact with the top face of the second semiconductor layer 15. The surface portion of the second semiconductor layer 15 disposed below the source electrode 17 and the drain electrode 18 is doped with Si at a high concentration, and the ohmic contact resistance is reduced to approximately $2 \times 10^{-6}$ $\Omega cm^2$.

In the FET of this embodiment, a current can be allowed to flow to a two-dimensional electron gas channel without passing through a hetero barrier formed between the AlGaN and the GaN. Also, the ionization energy of Si is smaller in GaN than in AlGaN, and the carrier concentration can be made higher. Moreover, the ohmic contact resistance of the source electrode and the drain electrode can be lowered when the electrodes are formed on GaN than when they are formed on AlGaN. In this manner, a field effect transistor with lower series resistance can be realized.

It is noted that the direction of the gate finger preferably accords with the <11-20> direction of the zone axis of the GaN film because thus the linearity of the regrowth face can be improved.

The second semiconductor layer 15 may be made of quartemary mixed crystal of $In_{0.09}Al_{0.33}Ga_{0.58}N$ or the like. Thus, the electron affinity is reduced so as to reduce contact resistance with an electrode made of Ti and Al or the like.

Embodiment 3

Figure 5:
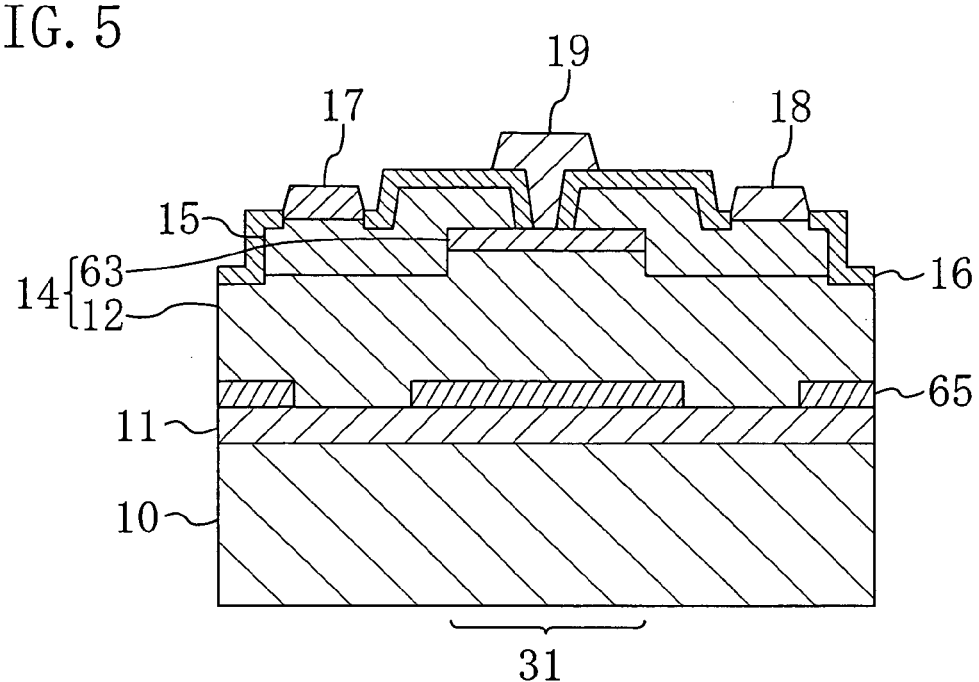
FIG. 5 is a cross-sectional view of a field effect transistor according to Embodiment 3 of the invention.

Embodiment 3 of the invention will now be described with reference to the accompanying drawings. FIG. 5 shows the cross-sectional structure of an FET according to Embodiment 3. In FIG. 5, like reference numerals are used to refer to like elements shown in FIG. 3 so as to omit the description.

As shown in FIG. 5, the FET of this embodiment is characterized by a hetero structure of AlN and GaN. Since the hetero structure of AlN and GaN is employed, the sheet carrier concentration attained after forming hetero junction can be as low as a level of $1 \times 10^{12}$ $cm^{-2}$. Also, a threshold voltage can be controlled by changing the thickness of the AlN film owing to an internal electric field derived from polarization within the AlN film. Since the threshold voltage can be made positive by reducing the thickness of the AlN film, an FET capable of normally off operation can be obtained.

Figure 6:
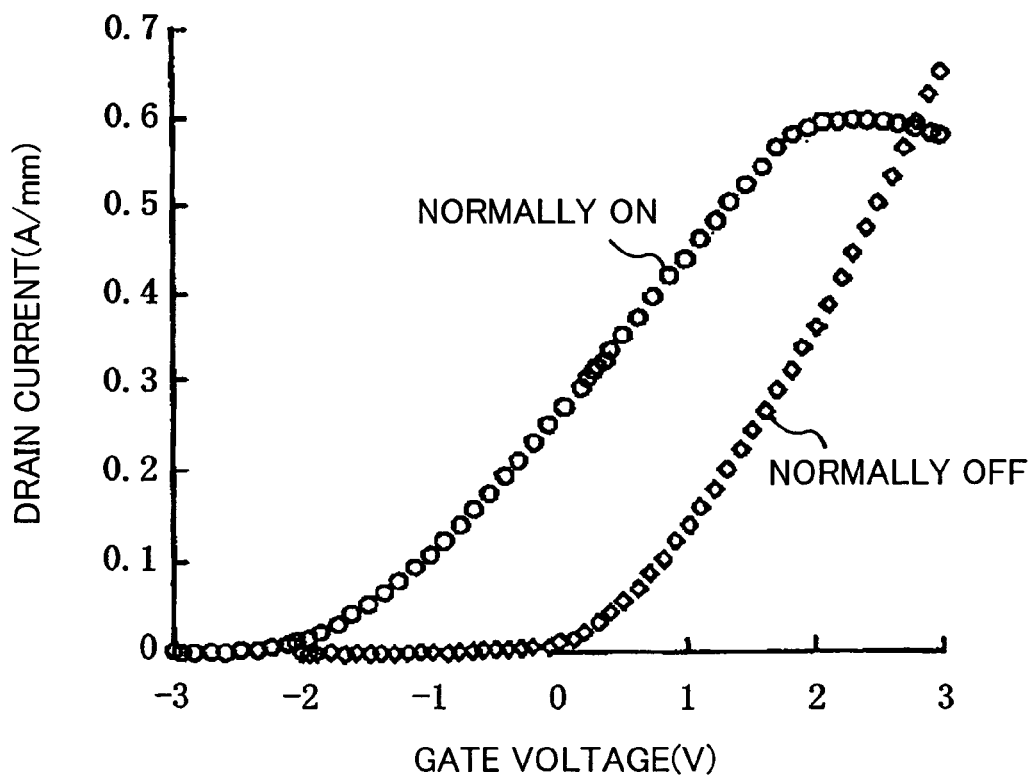
FIG. 6 is a graph for showing the relationship between a drain current and a gate voltage obtained in the field effect transistor of Embodiment 3.

FIG. 6 shows the relationship between a drain current and a gate voltage measured in the FET of this embodiment. The FET of this embodiment exhibits a normally off characteristic with the threshold voltage in the vicinity of 0 V. On the other hand, the FET of Embodiment 2 having the hetero junction structure of AlGaN and GaN exhibits a normally on characteristic with the threshold voltage of approximately −2 V. It is noted that the thickness of the AlN film and the AlGaN film is 25 nm in the measurement performed for obtaining FIG. 6.

Furthermore, in this embodiment, GaN is not used in a substrate but a crystal growth mask of $SiO_2$ is used for reducing crystal defects by employing regrowth designated as ELO (epitaxial lateral overgrowth). Specifically, a crystal growth mask of $SiO_2$ is formed on a substrate of sapphire in the shape of, for example, stripes parallel to a gate electrode, and an undoped GaN film is regrown thereon. Thus, the dislocation density can be reduced to approximately $1 \times 10^{16}$ $cm^{-2}$.

Figure 7A:
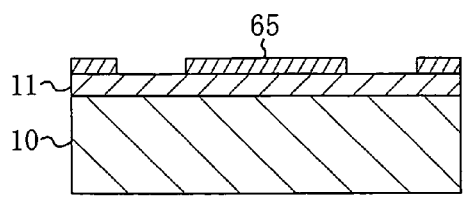
FIGS. 7A, 7B, 7C, 7D, 7E, 7F, 7G and 7H are cross-sectional views for showing procedures in a method for fabricating the field effect transistor of Embodiment 3.

FIGS. 7A through 7H are cross-sectional views for showing procedures in a fabrication method for the FET of Embodiment 3. First, as shown in FIG. 7A, after a buffer layer 11 of AlN with a thickness of 1 μm is formed by the MOCVD on the (0001) plane of the plane direction of a substrate 10 of sapphire, a crystal growth mask 65 of $SiO_2$ with a thickness of 100 nm is formed by the CVD.

Figure 7B:
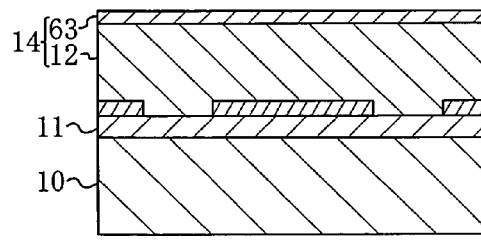

Next, as shown in FIG. 7B, the crystal growth mask 65 is patterned into stripes with a width of, for example, 10 μm and a gap of 2 μm, and an undoped GaN film 12 with a thickness of 3 μm and an undoped AlN film 63 are successively deposited thereon by the MOCVD, thereby forming a first semiconductor layer 14.

Figure 7C:
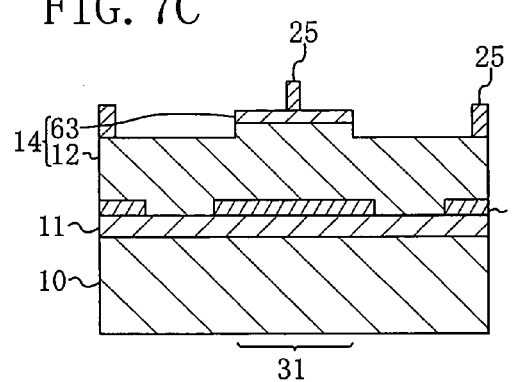

Then, as shown in FIG. 7C, in portions of the first semiconductor layer 14 excluding a source electrode forming region, a drain electrode forming region and a transistor forming region, the AlN film 63 and a part of the GaN film 12 are selectively removed by the dry etching such as the ICP etching, thereby forming a mesa portion 31. Subsequently, after forming a $SiO_2$ film with a thickness of, for example, 200 nm on the first semiconductor layer 14 by the CVD, the $SiO_2$ film is patterned so as to form a mask 25 covering the gate electrode forming region and regions outside the source electrode forming region and the drain electrode forming region. Furthermore, the mask 25 is etched by the RIE or the like so as to reduce its line width.

Figure 7D:
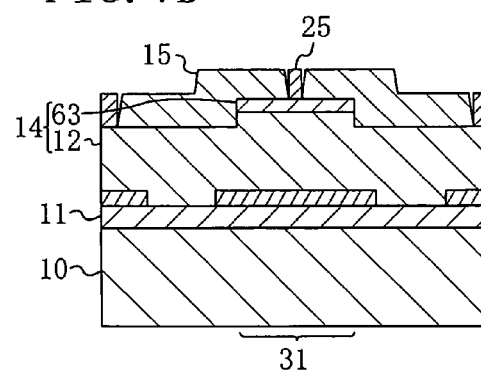

Then, as shown in FIG. 7D, a second semiconductor layer 15 of n-type GaN with a thickness of 50 nm is selectively grown by the MOCVD on the first semiconductor layer 14 on which the mask 25 has been formed. The carrier concentration of the second semiconductor layer 15 is set to be as high as approximately $1 \times 10^{19}$ $cm^{-3}$. Subsequently, a portion of the mask 25 corresponding to the gate electrode forming region is covered with a photoresist or the like, and the mask 25 is removed by the wet etching using a HF aqueous solution or the like merely in the regions outside the source electrode forming region and the drain electrode forming region.

Figure 7E:
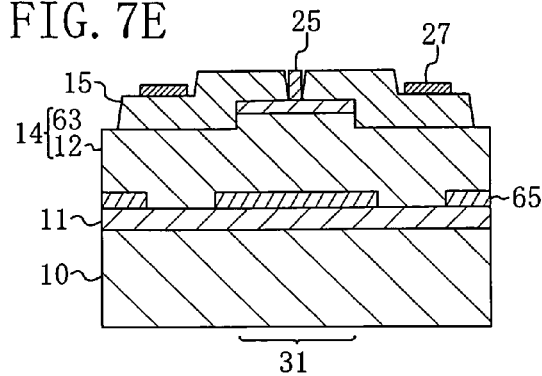

Next, as shown in FIG. 7E, a mask 27 of Si is formed on the second semiconductor layer 15 in the source electrode forming region and the drain electrode forming region by, for example, the electron-beam deposition and the lift-off.

Figure 7F:
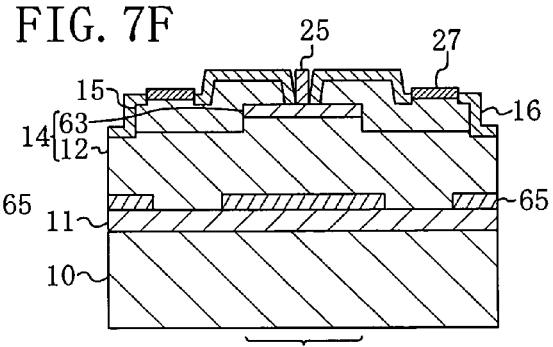

Subsequently, as shown in FIG. 7F, epitaxial growth layers, that is, the first semiconductor layer 14 and the second semiconductor layer 15, on which the mask 25 of $SiO_2$ and the mask 27 of Si have been formed are annealed at, for example, 1000° C. in an $O_2$ atmosphere for four hours, and thus, the epitaxial growth layers are selectively oxidized, thereby forming an insulating film 16 in their surface portions. In this oxidizing process, Si is diffused from the mask 27 toward the n-type second semiconductor layer 15, so as to increase the Si concentration in the surface portion of the semiconductor layer 15, and thus, the ohmic contact resistance of a source electrode and a drain electrode can be largely reduced. Although the source electrode and the drain electrode are formed on the AlGaN film in Embodiment 1, these electrodes are formed on the GaN film in this embodiment, and hence, the ohmic contact resistance can be further reduced, resulting in realizing contact resistance of $5 \times 10^{-6}$ $\Omega m^2$ or less.

Figure 7G:
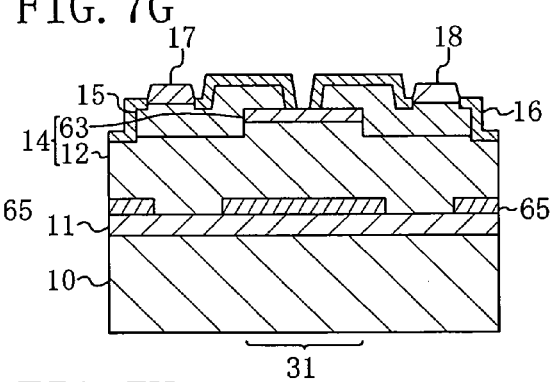

Then, as shown in FIG. 7G, after the mask 25 and the mask 27 are wet etched by using, for example, a mixed solution of hydrofluoric acid and nitric acid, the source electrode 17 and the drain electrode 18 made of, for example, a multilayer of Ti, Al, Ni and Au are formed on the second semiconductor layer 15 in the regions where the mask 27 has been formed.

Figure 7H:
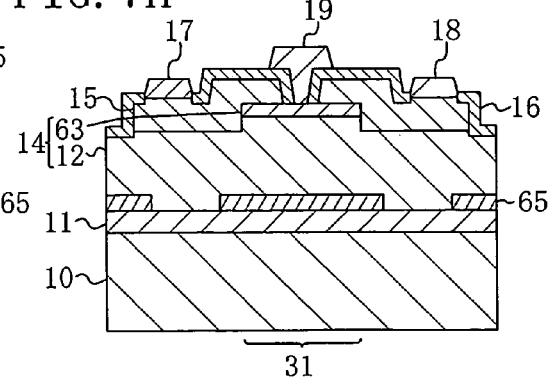

Next, as shown in FIG. 7H, a T-shaped gate electrode 19 of PdSi is formed in the region where the mask 25 has been formed. Since the oxide film is grown in the lateral direction in the oxidizing process, the width of the opening where the gate electrode 19 is to be formed can be made smaller than the width of the mask 25. For example, even in the case where the mask 25 has a width of approximately 200 nm, the width of the opening obtained after the oxidizing process can be made as small as approximately 100 nm. Thus, since the insulating film 16 is formed, a field effect transistor with a shorter gate length can be realized as compared with the case where the gate electrode is directly formed in the opening.

According to the FET and the fabrication method for the same of this embodiment, an FET with a short gate length of approximately 100 nm can be fabricated by using an optical stepper without employing the electron-beam lithography. Accordingly, a GaN-based FET including a T-shaped short gate electrode having good high-frequency characteristics can be fabricated at lower cost than in the conventional technique. Also, since all the surfaces of the device excluding the electrodes are covered with the selectively oxidized film, the isolation characteristic is improved, and hence, an FET with a small leakage current can be realized.

Furthermore, since the FET has a hetero structure composed of AlN and GaN, a normally off operation, which is indispensable as a high-power transistor, can be realized with keeping low on resistance by reducing the thickness of the AlN film 63.

Modification of Embodiment 3

Figure 8:
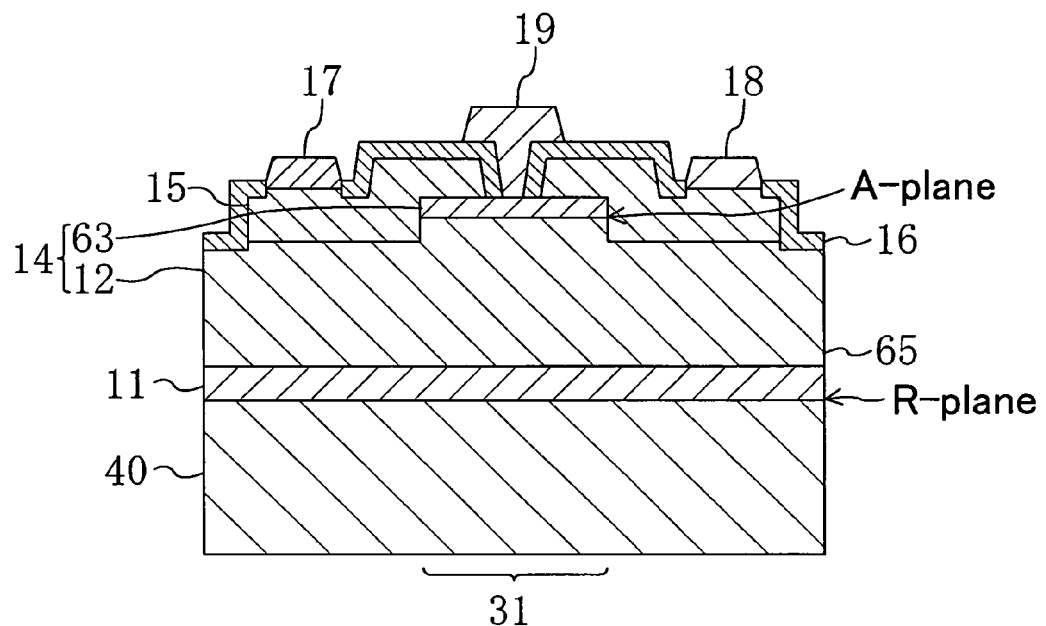
FIG. 8 is a cross-sectional view of a field effect transistor according to a modification of Embodiment 3.
Figure 9:
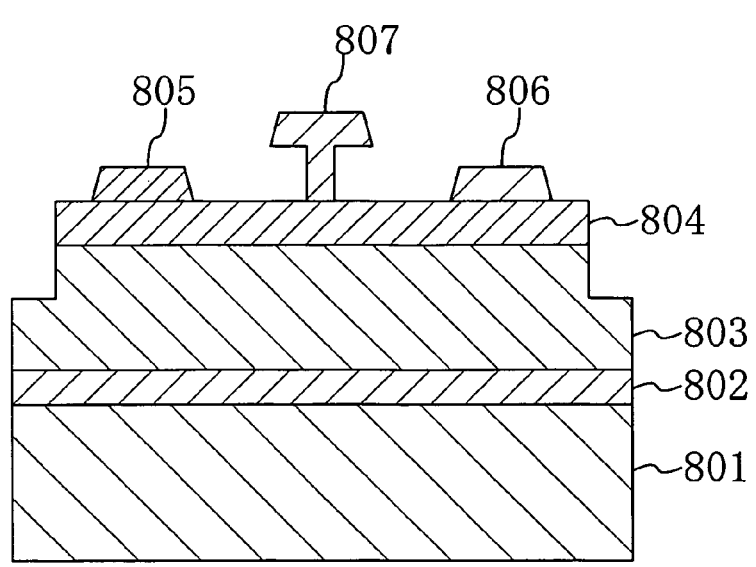
FIG. 9 is a cross-sectional view of a conventional field effect transistor.

A modification of Embodiment 3 will now be described with reference to the accompanying drawing. FIG. 8 shows the cross-sectional structure of a semiconductor device according to a modification of Embodiment 3. In FIG. 8, like reference numerals are used to refer to like elements shown in FIG. 5 so as to omit the description.

As shown in FIG. 8, in the semiconductor device of this modification, a first semiconductor layer 14 and a second semiconductor layer 15 are formed on an R-plane corresponding to the (1-102) plane of the plane direction of a substrate 40 of sapphire. The principal plane of the first semiconductor layer 14 and the second semiconductor layer 15 formed on the R-plane of the substrate 40 is an A-plane corresponding to the (11-20) plane of the plane direction. Since polarization is not caused vertically to the A-plane, no carriers are generated on an undoped hetero interface. Also, since an AlN film 63 has a very large band gap of 6.2 eV, this semiconductor device has a MIS (metal-insulator-semiconductor) structure in which carriers cannot be generated on the hetero junction until a positive voltage is applied to the gate electrode. Accordingly, what is called a normally off operation can be easily realized, and a drain current can be increased because a high positive voltage of, for example, 5 V or more can be applied to the gate electrode. It is noted that a mesa portion 31 preferably has a small width for reducing on resistance and parasitic resistance.

Although the principal plane of the substrate is the (11-20) plane of the plane direction in this modification, it may be a non-polar plane such as the (1-100) plane.

Although the gate electrode is in contact with the oxide film formed on the second semiconductor layer in each of the embodiments and the modification, the T-shaped gate electrode may be formed by patterning through photolithography after removing the oxide film. In this case, the gate electrode may not be in contact with the inner wall of the opening. Also, although the opening is formed by forming the second semiconductor layer after forming the mask, the opening may be formed by etching after forming the second semiconductor layer. In the case where the opening is formed by the etching, depending upon the structure of the semiconductor layers, a portion of the second semiconductor layer may remain on the bottom of the opening without allowing the opening to penetrate through the second semiconductor layer.

The substrate may be made of SiC, ZnO, Si, GaAs, GaP, InP, LiGaO$_2$, LiAlO$_2$, mixed crystal of LiGaO$_2$ and LiAlO$_2$ or the like instead of sapphire or GaN. The buffer layer is not limited to an AlN layer but may be made of any nitride semiconductor represented by Al$_x$In$_y$Ga$_{(1-x-y)}$N (wherein $0 \leq x \leq 1$, $0 \leq y \leq 1$ and $x+y \leq 1$) as far as good GaN crystal can be obtained on the buffer layer.

The number of films included in the multilayer, the composition, the order of multilayered films or the like of the first semiconductor layer 14 can be freely selected as far as desired transistor characteristics can be attained. The method for growing the epitaxial growth layer may be molecular beam epitaxy (MBE), hydride vapor phase epitaxy (HVPE) or the like instead of the MOCVD. The epitaxial growth layer may include, as a composing element, a group V element such as As or P or a group III element such as B.

As described so far, according to the field effect transistor and the fabrication method for the same of this invention, a nitride-based field effect transistor including a T-shaped gate electrode can be realized without performing the electron-beam exposure in the fabrication. Thus, the invention is useful as a high-power transistor, a high-frequency transistor or the like and a method for fabricating the same.

What is claimed is:

1. A field effect transistor comprising:
    a first semiconductor layer made of a multilayer of a plurality of semiconductor films;
    a second semiconductor layer formed in contact with a principal plane of said first semiconductor layer;
    a source electrode and a drain electrode spaced from each other and formed on a face of said second semiconductor layer opposite to said first semiconductor layer;
    an opening formed in a portion of said second semiconductor layer sandwiched between said source electrode and said drain electrode and exposing said first semiconductor layer therein; and
    a gate electrode in contact with a portion of said first semiconductor layer exposed in said opening,
    wherein said first semiconductor layer has a mesa portion located directly below said gate electrode;
    said second semiconductor layer covers an upper surface and a side surface of said mesa portion; and
    said gate electrode is in direct contact with said mesa portion.

2. The field effect transistor of claim 1, wherein said first semiconductor layer includes a two-dimensional electron gas layer formed below said gate electrode.

3. The field effect transistor of claim 1, further comprising an insulating film formed at least on an inner wall of said opening,
    wherein said insulating film is formed in such a manner as to cover the portion of said second semiconductor layer sandwiched between said source electrode and said drain electrode.

4. The field effect transistor of claim 3, wherein a portion of said insulating film formed on the inner wall of said opening has a larger thickness than other portions of said insulating film formed on a top surface of said second semiconductor layer.

5. The field effect transistor of claim 1, wherein said first semiconductor layer has a portion which is exposed in said opening of said second semiconductor layer and is in direct contact with said gate electrode, and which is different from said second semiconductor layer in at least one of a carrier concentration and a composition.

6. The field effect transistor of claim 1, further comprising an insulating film formed at least on an inner wall of said opening.

7. The field effect transistor of claim 1, wherein said mesa portion includes a two-dimensional electron gas layer extending between side walls of said mesa portion.

8. The field effect transistor of claim 1, wherein said first semiconductor layer is made of a group III-V nitride semiconductor.

9. The field effect transistor of claim 8, wherein said first semiconductor layer includes a gallium nitride film and a film represented by a general formula of $Al_xGa_{1-x}N$ (wherein $0<x\leq1$) formed on said gallium nitride film.

10. The field effect transistor of claim 8, wherein said second semiconductor layer is made of gallium nitride or a compound represented by a general formula of $In_yAl_zGa_{(1-y-z)}N$ (wherein $0<y\leq1$, $0<z<1$ and $y+z<1$).

11. The field effect transistor of claim 8,
wherein said first semiconductor layer includes a gallium nitride film that is formed on a principal plane of a substrate and has a (11-20) plane of a plane direction as a principal plane thereof, and
said substrate is made of sapphire having a (1-102) plane of the plane direction as the principal plane thereof.

12. The field effect transistor of claim 8,
wherein said first semiconductor layer is formed on a (0001) plane of a plane direction of a substrate, and
said gate electrode is linearly formed along a <11-20> direction of a zone axis of said substrate.

13. The field effect transistor of claim 1, further comprising an insulating film formed at least on an inner wall of said opening,
wherein said insulating film continuously covers said inner wall of said opening and a top surface of said second semiconductor layer.

14. The field effect transistor of claim 1, wherein said second semiconductor layer is in contact with the side surface of said mesa portion, and an interface between said plurality of semiconductor films are exposed on a side of said mesa portion.

15. The field effect transistor of claim 1, wherein said second semiconductor layer includes a portion covering said upper surface of said mesa portion, and a portion covering said side surface of said mesa portion, said portions of said second semiconductor layer being integrally formed with each other, and being made of the same material.

* * * * *